(12) United States Patent
Lee et al.

(10) Patent No.: US 8,501,523 B2
(45) Date of Patent: Aug. 6, 2013

(54) DEPOSITING TITANIUM SILICON NITRIDE FILMS FOR FORMING PHASE CHANGE MEMORIES

(75) Inventors: Jong-Won Lee, San Francisco, CA (US); Kuo-Wei Chang, Sunnyvale, CA (US); Michael L. McSwiney, Scappoose, OR (US)

(73) Assignee: Micron Technology, Inc., Boise, ID (US)

( * ) Notice: Subject to any disclaimer, the term of this patent is extended or adjusted under 35 U.S.C. 154(b) by 1300 days.

(21) Appl. No.: 10/977,186

(22) Filed: Oct. 28, 2004

(65) Prior Publication Data

US 2006/0091492 A1    May 4, 2006

(51) Int. Cl.
*H01L 21/00* (2006.01)
*H01L 21/31* (2006.01)

(52) U.S. Cl.
USPC .............. 438/95; 438/238; 438/785; 438/786

(58) Field of Classification Search
USPC .......................................................... 438/786
See application file for complete search history.

(56) References Cited

U.S. PATENT DOCUMENTS

| | | | | |
|---|---|---|---|---|
| 5,252,518 | A * | 10/1993 | Sandhu et al. | 438/681 |
| 7,135,696 | B2 * | 11/2006 | Karpov et al. | 257/2 |
| 2003/0036232 | A1 * | 2/2003 | Dennison | 438/257 |
| 2003/0108674 | A1 * | 6/2003 | Chung et al. | 427/255.394 |
| 2004/0048467 | A1 * | 3/2004 | Marsh | 438/680 |
| 2006/0073631 | A1 * | 4/2006 | Karpov et al. | 438/102 |

* cited by examiner

*Primary Examiner* — Lex Malsawma
(74) *Attorney, Agent, or Firm* — Dorsey & Whitney LLP

(57) ABSTRACT

Organometallic precursors may be utilized to form titanium silicon nitride films that act as heaters for phase change memories. By using a combination of TDMAT and TrDMASi, for example in a metal organic chemical vapor deposition chamber, a relatively high percentage of silicon may be achieved in reasonable deposition times, in some embodiments. In one embodiment, two separate bubblers may be utilized to feed the two organometallic compounds in gaseous form to the deposition chamber so that the relative proportions of the precursors can be readily controlled.

20 Claims, 9 Drawing Sheets

DEPOSITING TITANIUM SILICON NITRIDE FILMS FOR FORMING PHASE CHANGE MEMORIES

BACKGROUND

This invention relates generally to phase change memories.

Phase change memory devices use phase change materials, i.e., materials that may be electrically switched between a generally amorphous and a generally crystalline state, as an electronic memory. One type of memory element utilizes a phase change material that may be, in one application, electrically switched between generally amorphous and generally crystalline local orders or between different detectable states of local order across the entire spectrum between completely amorphous and completely crystalline states.

Typical materials suitable for such an application include various chalcogenide elements. The state of the phase change materials is also non-volatile. When the memory is set in either a crystalline, semi-crystalline, amorphous, or semi-amorphous state representing a resistance value, that value is retained until reprogrammed, even if power is removed. This is because the programmed value represents a phase or physical state of the material (e.g., crystalline or amorphous).

In order to induce a phase change, a chalcogenide material may be subjected to heating by a heater. One desirable material for forming such heaters is titanium silicon nitride. Existing technology for forming titanium silicon nitride films generally involves first forming a thin titanium nitride film using tetrakis-dimethylamino) titanium (TDMAT). Then, a silane treatment follows to add silicon to the titanium and nitride provided from the TDMAT. However, such techniques have generally provided relatively low amounts of silicon and relatively low electrical resistivity. Other techniques are also known, all of which have various problems.

Thus, there is a need for other ways for making phase change memories.

DETAILED DESCRIPTION

Figure 1:
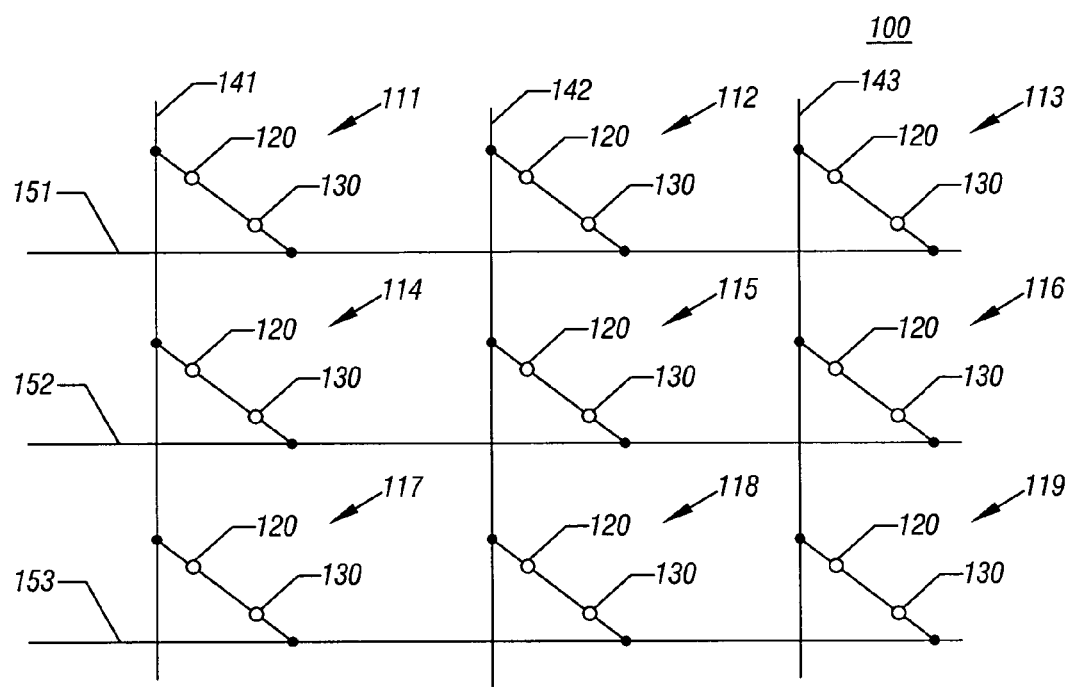
FIG. 1 is a schematic diagram illustrating a memory in accordance with one embodiment of the present invention.

Turning to FIG. 1, an embodiment of a memory 100 is illustrated. Memory 100 may include a 3×3 array of memory cells 111-119, wherein memory cells 111-119 each include a select device 120 and a memory element 130. Although a 3×3 array is illustrated in FIG. 1, the scope of the present invention is not limited in this respect. Memory 100 may have a larger array of memory cells.

In one embodiment, memory elements 130 may comprise a phase change material. In this embodiment, memory 100 may be referred to as a phase change memory. A phase change material may be a material having electrical properties (e.g. resistance, capacitance, etc.) that may be changed through the application of energy such as, for example, heat, light, voltage potential, or electrical current. Examples of a phase change material may include a chalcogenide material.

A chalcogenide alloy may be used in a memory element or in an electronic switch. A chalcogenide material may be a material that includes at least one element from column VI of the periodic table or may be a material that includes one or more of the chalcogen elements, e.g., any of the elements of tellurium, sulfur, or selenium.

Memory 100 may include column lines 141-143 and row lines 151-153 to select a particular memory cell of the array during a write or read operation. Column lines 141-143 and row lines 151-153 may also be referred to as address lines since these lines may be used to address memory cells 111-119 during programming or reading. Column lines 141-143 may also be referred to as bit lines and row lines 151-153 may also be referred to as word lines.

Memory elements 130 may be connected to row lines 151-153 and may be coupled to column lines 141-143 via select device 120. While one select device 120 is depicted, more select devices may also be used. Therefore, when a particular memory cell (e.g., memory cell 115) is selected, voltage potentials may be applied to the memory cell's associated column line (e.g., 142) and row line (e.g., 152) to apply a voltage potential across the memory cell.

Series connected select device 120 may be used to access memory element 130 during programming or reading of memory element 130. The select device 120 may be an ovonic threshold switch that can be made of a chalcogenide alloy that does not exhibit an amorphous to crystalline phase change and which undergoes rapid, electric field initiated change in electrical conductivity that persists only so long as a holding voltage is present. Select device 120 may operate as a switch that is either "off" or "on" depending on the amount of voltage potential applied across the memory cell, and more particularly whether the current through the select device exceeds its threshold current or voltage, which then triggers the device into the on state. The off state may be a substantially electrically nonconductive state and the on state may be a substantially conductive state, with less resistance than the off state. In the on state, the voltage across the select device is equal to its holding voltage $V_H$ plus IxRon, where Ron is the dynamic resistance from $V_H$. For example, select device 120 may have threshold voltage and, if a voltage potential less than the threshold voltage of a select device 120 is applied across select device 120, then at least one select device 120 may remain "off" or in a relatively high resistive state so that little or no electrical current passes through the memory cell and most of the voltage drop from selected row to selected column is across the select device. Alternatively, if a voltage potential greater than the threshold voltage of select device 120 is applied across select device 120, then the select device 120 may "turn on," i.e., operate in a relatively low resistive state so that electrical current passes through the memory cell. In other words, select device 120 may be in a substantially electrically nonconductive state if less than a predetermined voltage potential, e.g., the threshold voltage, is applied across select device 120. Select device 120 may be in a substantially conductive state if greater than the predetermined voltage potential is applied across select device 120. Select device 120 may also be referred to as an access device, an isolation device, or a switch.

In one embodiment, each select device 120 may comprise a switching material such as, for example, a chalcogenide alloy, and may be referred to as an ovonic threshold switch, or simply an ovonic switch. The switching material of select device 120 may be a material in a substantially amorphous state positioned between two electrodes that may be repeatedly and reversibly switched between a higher resistance "off" state (e.g., greater than about ten megaOhms) and a relatively lower resistance "on" state (e.g., about one thousand Ohms in series with $V_H$) by application of a predetermined electrical current or voltage potential. In this embodiment, each select device 120 may be a two terminal device that may have a current-voltage (I-V) characteristic similar to a phase change memory element that is in the amorphous state. However, unlike a phase change memory element, the switching material of select device 120 may not change phase. That is, the switching material of select device 120 may not be a programmable material, and, as a result, select device 120 may not be a memory device capable of storing information. For example, the switching material of select device 120 may remain permanently amorphous and the I-V characteristic may remain the same throughout the operating life. A representative example of I-V characteristics of select device 120 is shown in FIG. 2.

Figure 2:
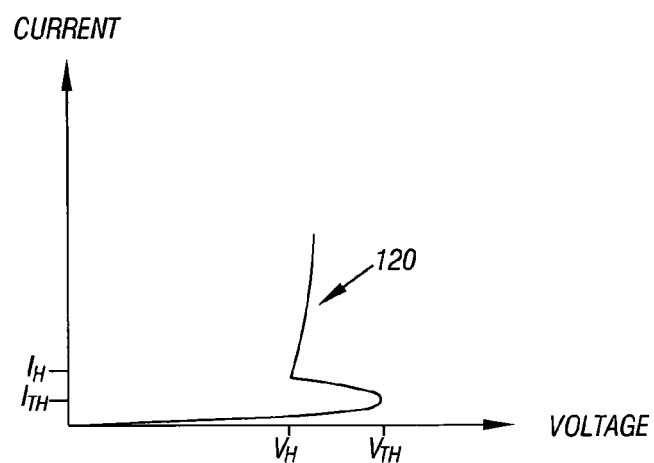
FIG. 2 is a diagram illustrating a current-voltage characteristic of an access device.

Turning to FIG. 2, in the low voltage or low electric field mode, i.e., where the voltage applied across select device 120 is less than a threshold voltage (labeled $V_{TH}$), select device 120 may be "off" or nonconducting, and exhibit a relatively high resistance, e.g., greater than about 10 megaOhms. Select device 120 may remain in the off state until a sufficient voltage, e.g., $V_{TH}$, is applied, or a sufficient current is applied, e.g., $I_{TH}$, that may switch select device 120 to a conductive, relatively low resistance on state. After a voltage potential of greater than about $V_{TH}$ is applied across select device 120, the voltage potential across select device 120 may drop ("snapback") to a holding voltage potential, labeled $V_H$. Snapback may refer to the voltage difference between $V_{TH}$ and $V_H$ of a select device.

In the on state, the voltage potential across select device 120 may remain close to the holding voltage of $V_H$ as current passing through select device 120 is increased. Select device 120 may remain on until the current through select device 120 drops below a holding current, labeled $I_H$. Below this value, select device 120 may turn off and return to a relatively high resistance, nonconductive off state until the $V_{TH}$ and $I_{TH}$ are exceeded again.

Figure 3:
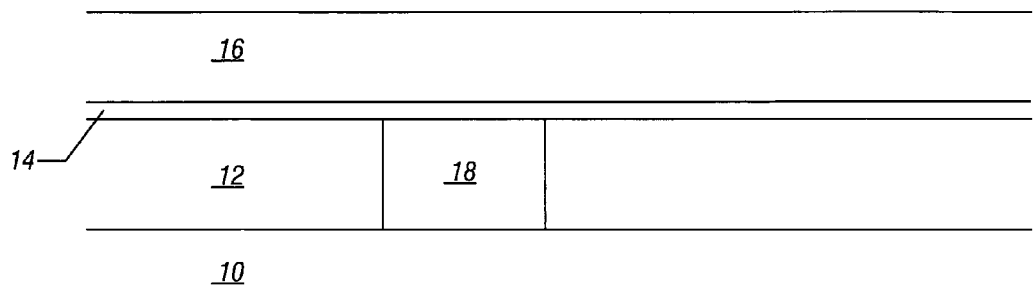
FIG. 3 is an enlarged, cross-sectional view at an early stage of manufacture in accordance with one embodiment of the present invention.

Referring to FIG. 3, a substrate 10 may include a semiconductor substrate and one or more layers thereover. Over the substrate 10 is a silicon dioxide layer 12 having a conductor 18 formed therein. In one embodiment, the conductor 18 is a row line 151-153 (FIG. 1). The oxide layer 12 may be a nitride layer 14 and another oxide layer 16 in accordance with conventional damascene processing.

Figure 4:
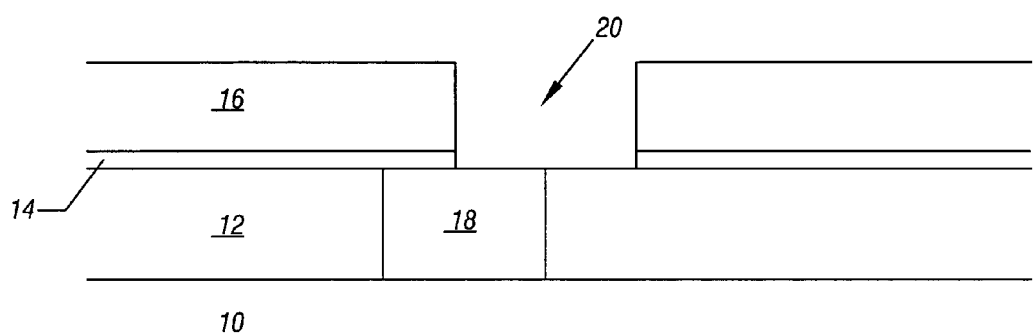
FIG. 4 is an enlarged, cross-sectional view of the embodiment shown in FIG. 3 at a subsequent stage of manufacture in accordance with one embodiment of the present invention.
Figure 5:
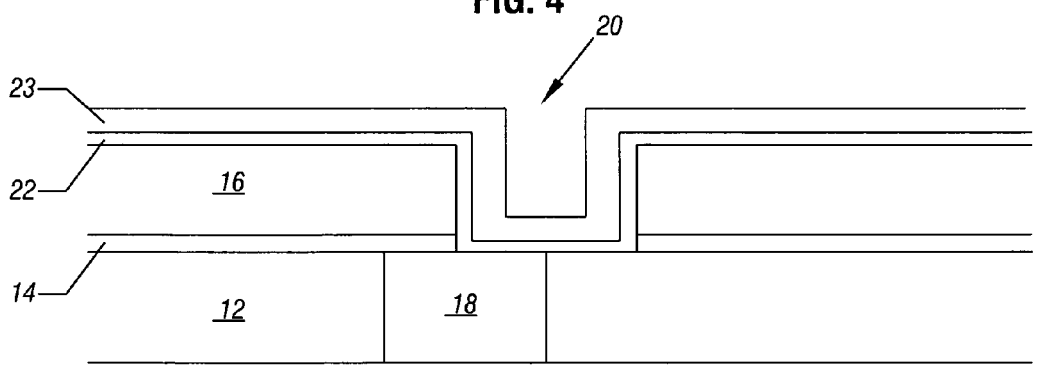
FIG. 5 is an enlarged, cross-sectional view of the embodiment shown in FIG. 4 at a subsequent stage of manufacture in accordance with one embodiment of the present invention.

A wall trench 20 may be formed through the layers 14 and 16 as shown in FIG. 4. The trench 20 may first be covered with a heater layer 22, for example of titanium silicon nitride, as shown in FIG. 5.

Figure 7:
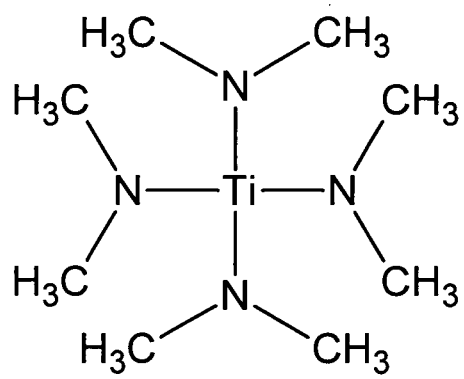
FIG. 7 is a depiction of the chemical structure of TDMAT.
Figure 8:
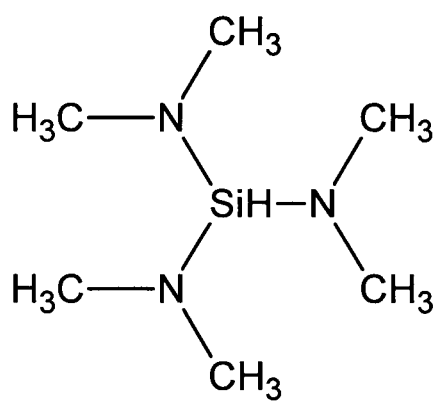
FIG. 8 is a depiction of the chemical structure of TrDMASi.

According to one embodiment of the present invention, tetrakis-(dimethylamino) titanium (TDMAT), whose chemical structure is shown in FIG. 7, may be utilized as a precursor to form the titanium silicon nitride film for phase change memory heater layer 22. A combination of TDMAT and tris-(dimethylamino) silane (TrDMASi) (whose chemical structure is shown in FIG. 8) may be utilized to form titanium silicon nitride films with relatively higher resistivity and relatively higher percentages of silicon. For example, titanium silicon nitride films with greater than 10 atomic percent silicon may be formed. The higher the silicon content, the higher the resistivity of the film. The higher the film's resistivity, the better it functions to heat a phase change material in response to current flow.

The two amine or organometallic precursors can be premixed or mixed in situ to form the titanium silicon nitride film, effectively, in a one-step process in some embodiments. In other words, a film of TDMAT need not be applied, followed by deposition of silane.

In some embodiments, conventional metal-organic chemical vapor deposition (MOCVD), plasma enhanced chemical vapor deposition (PECVD), laser assisted chemical vapor deposition, or atomic layer deposition (ALD) may be utilized. The ratio of those precursors can range from 5 to 95 atomic percent TDMAT and from 5 to 95 atomic percent TrDMASi. In one embodiment, the ratio of TDMAT to TrDMASi is about one to ten.

Figure 6:
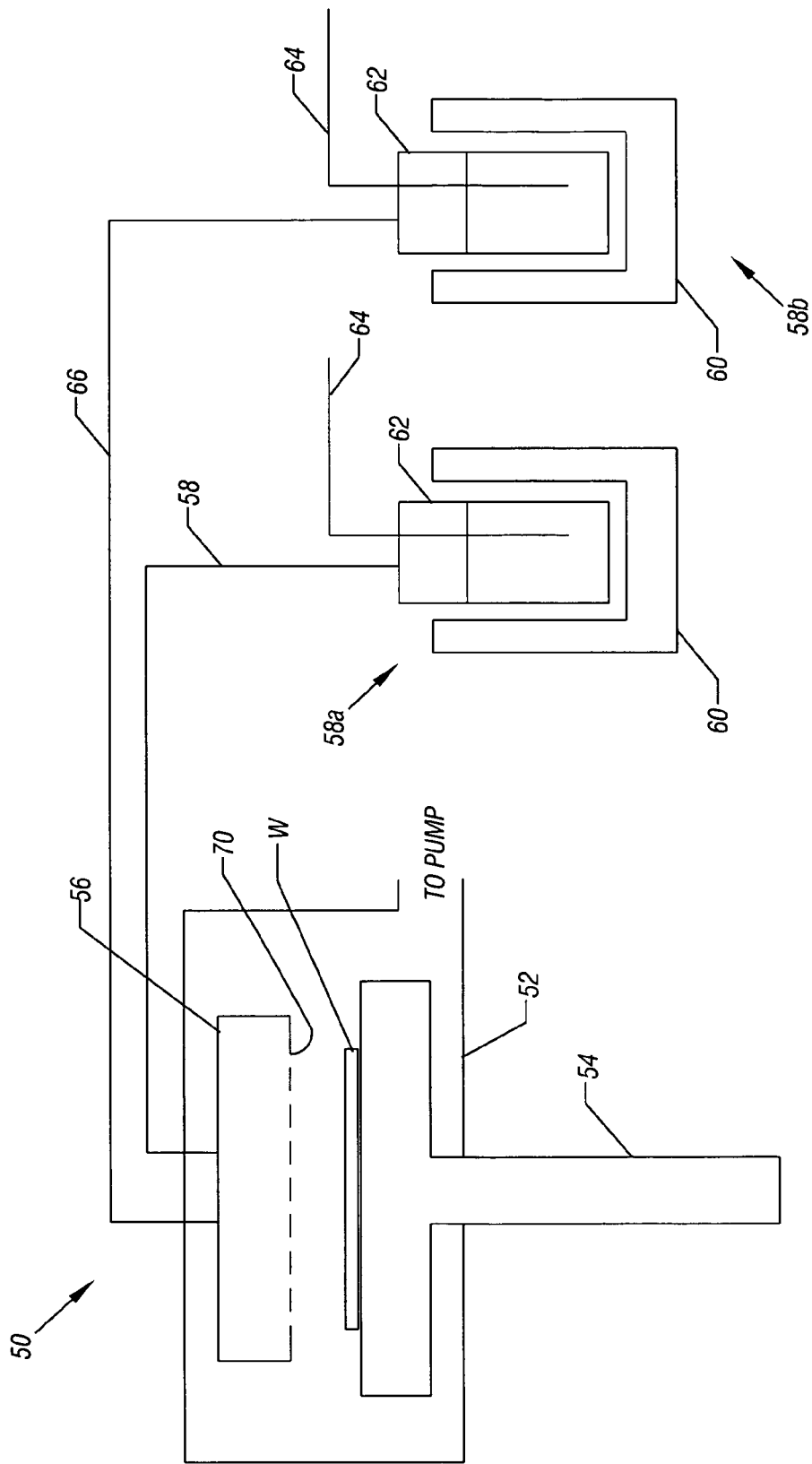
FIG. 6 is a schematic depiction of a chemical vapor deposition chamber in accordance with one embodiment of the present invention.

A variety of different deposition chamber configurations may be utilized. In FIG. 6, a MOCVD apparatus 50 includes a chamber 52. A pedestal 54 supports the wafer W. A gas box 56 with a showerhead 70, having apertures therein, may be provided within the chamber 52. The gas box 56 receives TrDMASi vapor from the bubbler 58b and TDMAT vapor from the bubbler 58a. Each bubbler chamber 62 may be surrounded by a heater 60. A source of pressurized helium 64 may act as a diluent gas to the bubblers 58.

The amount of heat supplied by each heater 60 may be controlled to control the proportion of liquid organometallic precursor which is converted to vapor and conveyed by a line 66 or 68 to the gas box 56. In other words, depending on the rate of vaporization, and the heat and pressure applied, one can control the amount of vapor from each bubbler 58. Thus, the operator can control the ratio of TDMAT to TrDMASi vapor that is supplied to form the titanium silicon nitride layer on the wafer W.

One reason for using two bubblers 58 in one embodiment of the present invention is that it has been determined that the vaporization rates of the two organometallic precursors are different. Thus, if they were bubbled in one bubbler, the ratio of the precursors in the resulting titanium silicon nitride film would be fixed by their vaporization rates. Using separate bubblers 58 enables tailoring of the ratio of the precursors in the final film.

In one embodiment, the bubblers 58 may be operated at around 50° C., while the chamber 52 may be maintained between 400° and 500° C. Excess gas within the chamber 52 may be withdrawn by a pump as indicated in FIG. 6.

Generally, the more silicon in the titanium silicon nitride films, the higher resistivity of the resulting compound. In one advantageous embodiment, a ratio of TDMAT to TrDMASi of one to ten may be utilized to achieve about 20 atomic percent silicon.

However, in other embodiments, a single bubbler may be utilized. In addition, direct liquid injection (DLI) may be utilized. In direct liquid injection, a deposition chamber may be maintained at a temperature of from 400° to 500° C. In one embodiment, a mixture of the two organometallic precursors, in liquid form, may be directly injected into the chamber for in situ vaporization and deposition.

In one embodiment, the layer 22 may be approximately 50 Angstroms thick. Over the layer 22 is a layer of nitride 23 (FIG. 5) that, in one embodiment, may be about 200 Angstroms thick. Finally, over the layer 23 may be a layer of deposited oxide which, in one embodiment, may be about 900 Angstroms thick.

Figure 9:
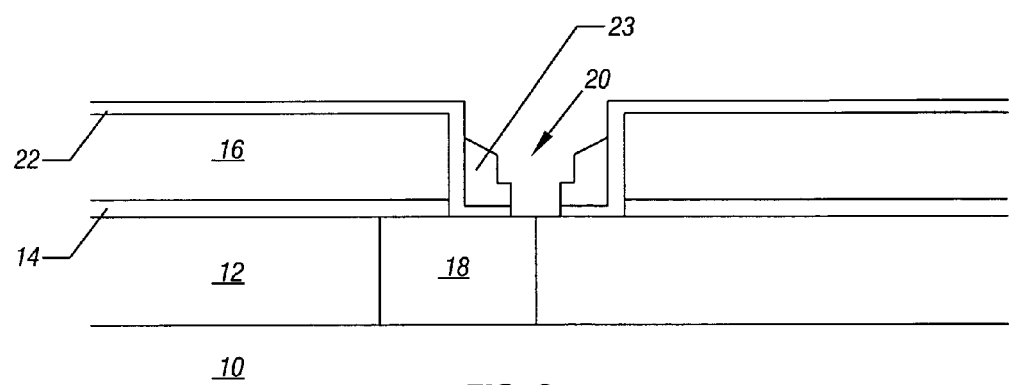
FIG. 9 is an enlarged, cross-sectional view of the embodiment shown in FIG. 5 at a subsequent stage of manufacture in accordance with one embodiment of the present invention.
Figure 10:
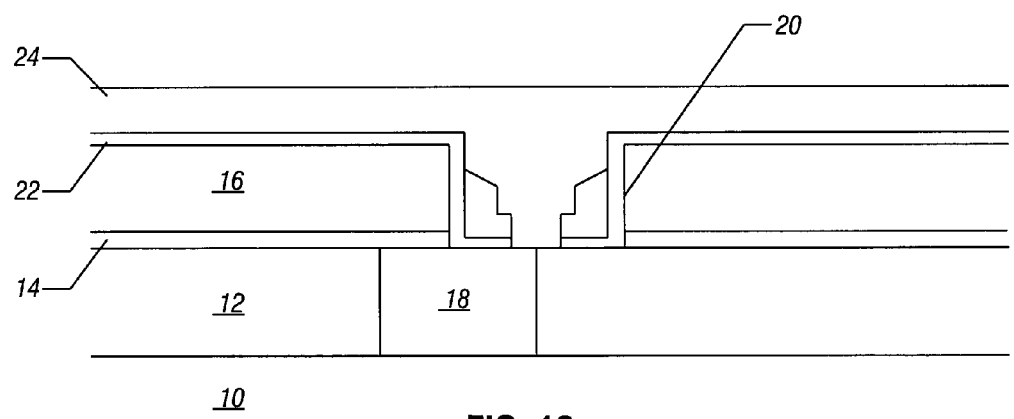
FIG. 10 is an enlarged, cross-sectional view of the embodiment shown in FIG. 9 at a subsequent stage of manufacture in accordance with one embodiment of the present invention.

As shown in FIGS. 9 and 10, the trench 20 may be situated with its center over the right edge of the conductor 18 in one embodiment of the present invention. As shown in FIG. 9, the structure of FIG. 5 may be masked to form a via down to the conductor 18. In the course of that etch process, the horizontal surface of the layer 23 may be substantially removed as well as the upper portion of the vertical surface thereof. Then as shown in FIG. 10 the structure may be covered with an insulating layer 24.

Figure 11:
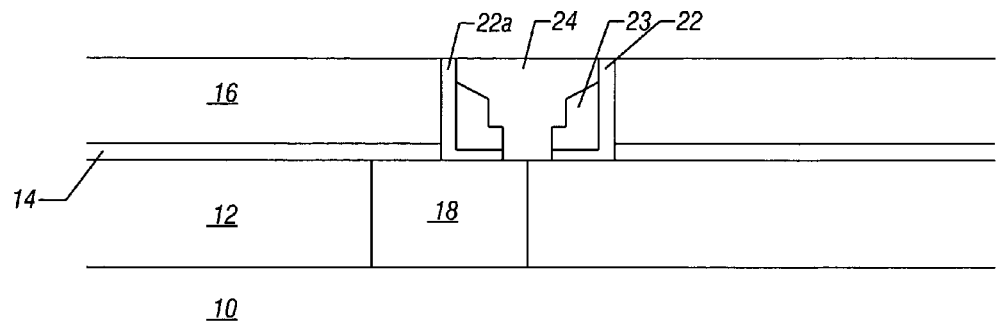
FIG. 11 is an enlarged, cross-sectional view of the embodiment shown in FIG. 10 at a subsequent stage of manufacture in accordance with one embodiment of the present invention.

Referring to FIG. 11, the structure shown in FIG. 10 may be planarized. As a result, the layer 22 that will act as a heater to change the phase of an overlying phase change material is U-shaped. Its offset positioning will enable the left upstanding arm of the layer 22 to act as a wall heater 22*a*, aligned under an overlying phase change material. The thickness of the wall heater 22*a* may be adjusted by adjusting the thickness of the deposited layer 22. Then, the wall heater 22*a* acts as a thin heating plate arranged on edge.

Figure 12:
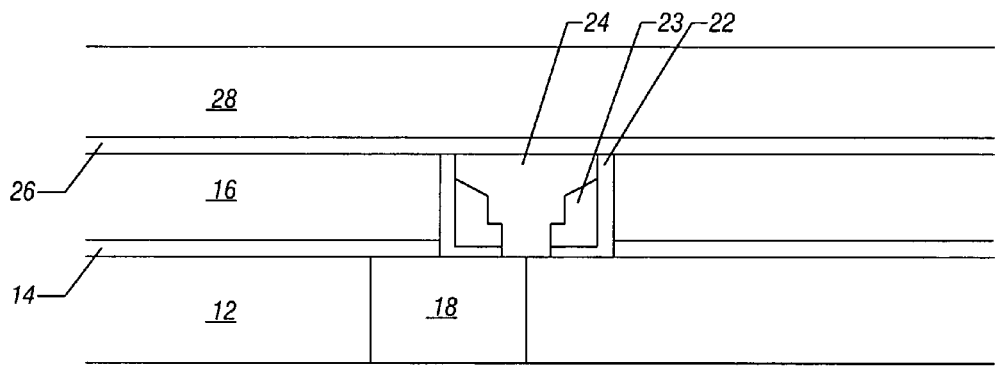
FIG. 12 is an enlarged, cross-sectional view of the embodiment shown in FIG. 11 at a subsequent stage of manufacture in accordance with one embodiment of the present invention.
Figure 13:
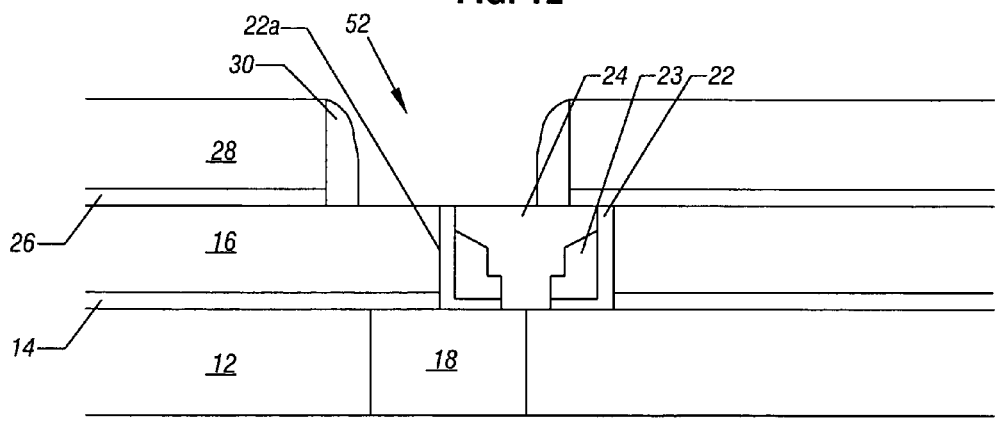
FIG. 13 is an enlarged, cross-sectional view of the embodiment shown in FIG. 12 at a subsequent stage of manufacture in accordance with one embodiment of the present invention.

Then, another nitride layer 16 and oxide layer 28 may be formed as indicated in FIG. 12. Next, a trench 52 is formed through the layers 26 and 28 and sidewall spacers 30 are formed thereon. A sidewall spacer 30 may be formed of nitride in one embodiment of the present invention. As indicated, the trench 52, lined with the spacer 30, may be aligned with the conductor 18, in one embodiment of the present invention, but because the trench 52 is wider than the conductor 18, the trench 52 extends laterally to either side of the conductor 18 as depicted in FIG. 13.

Figure 14:
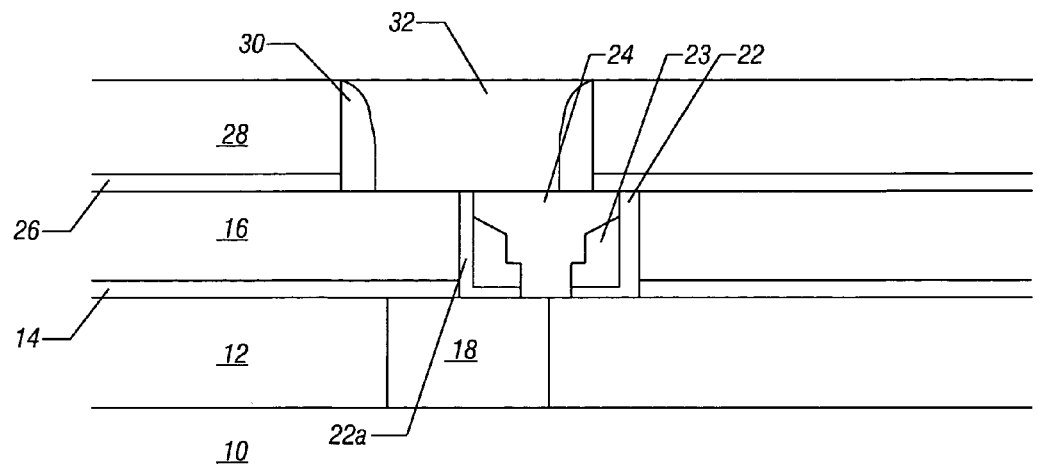
FIG. 14 is an enlarged, cross-sectional view of the embodiment shown in FIG. 13 at a subsequent stage of manufacture in accordance with one embodiment of the present invention.

Then, as shown in FIG. 14, the trench 52 may be filled with a phase change memory material 32 that is subsequently planarized to achieved the structure shown in FIG. 14. At this point the heater 22*a* is aligned centrally below the material 32. The material 32 forms a damascene memory element 130, defined within a trench in dielectric layers.

Figure 15:
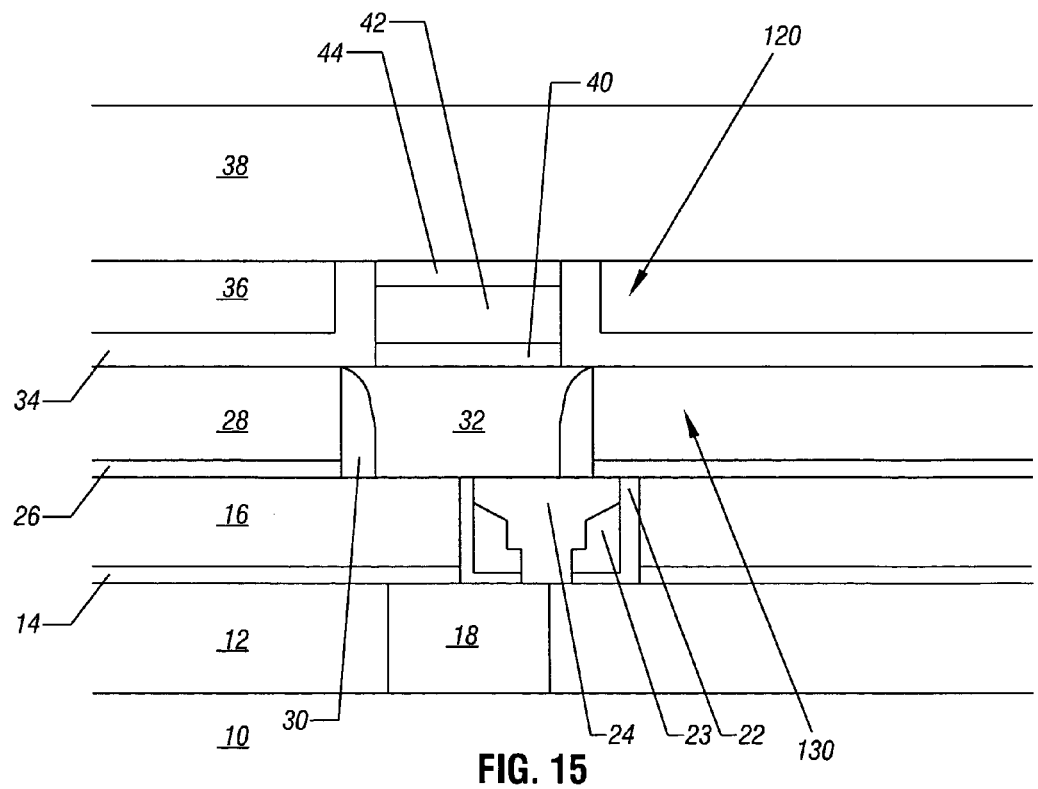
FIG. 15 is an enlarged, cross-sectional view taken generally along the line 13-13 in FIG. 16 of the embodiment shown in FIG. 14 at a subsequent stage of manufacture in accordance with one embodiment of the present invention.

Thereafter, as shown in FIG. 15, a select device or ovonic threshold device 120 (FIG. 1) is formed over the memory material 32, that forms the memory element 120 (FIG. 1). The select device 120 may include an L-shaped nitride layer 34, an oxide layer 36, and a conductor 38 that may be a column line 141-143 (FIG. 1). A memory material 42 is formed between upper electrode 44 and lower electrode 40. The nitride layer 34 may be formed by depositing the layer 34 over the stack of the memory material 42 and electrodes 44 and 40 and then filling with the oxide layer 36 to follow by planarizing the entire structure. This sequence is followed by the formation of the upper conductor 38.

Figure 16:
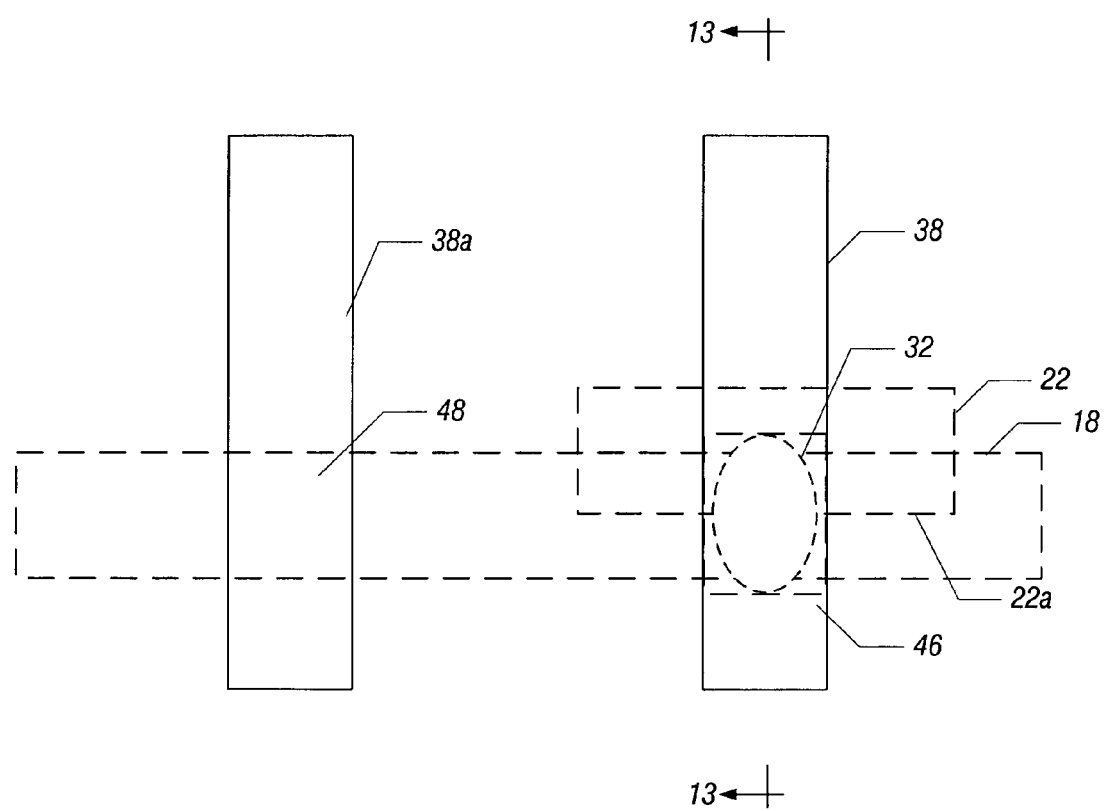
FIG. 16 is an enlarged, top plan view which is reduced relative to FIG. 15 in accordance with one embodiment of the present invention.
Figure 17:
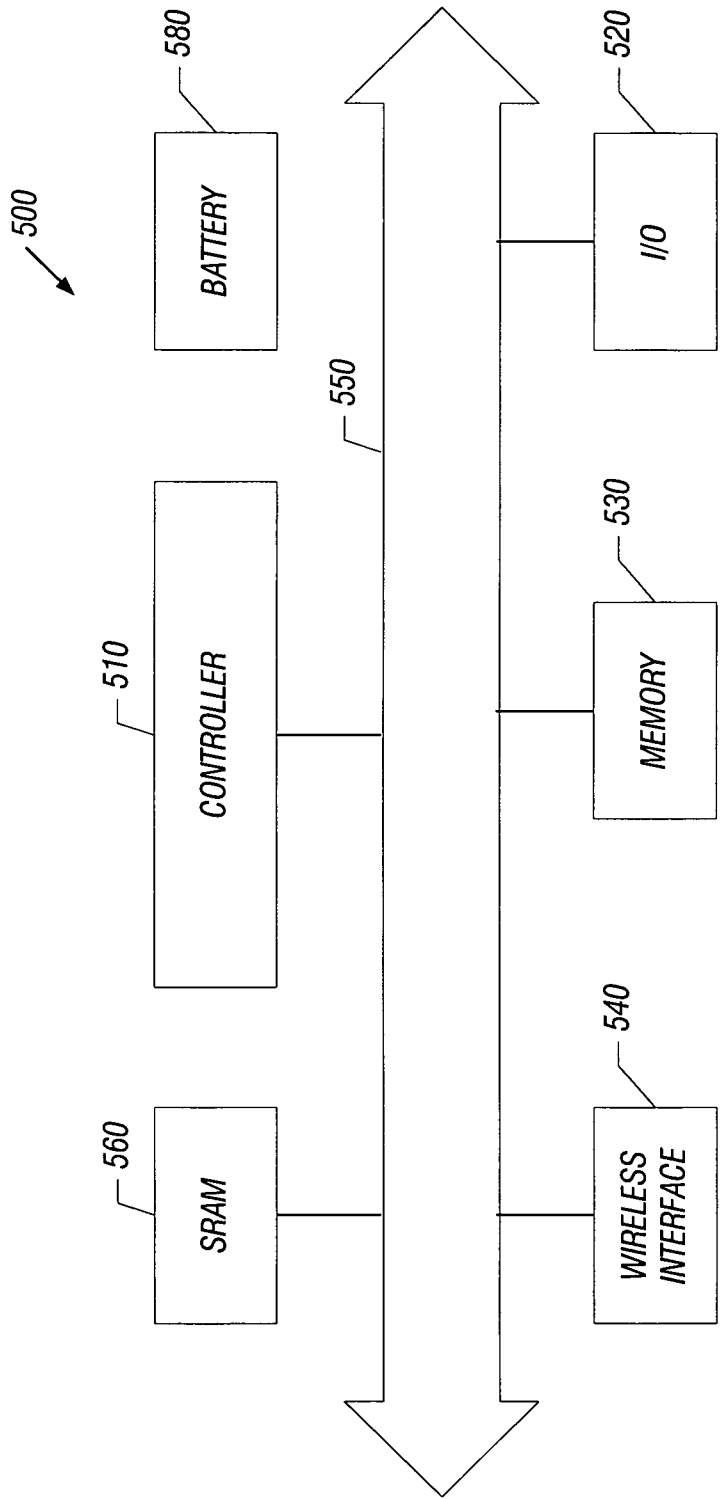
FIG. 17 is a schematic depiction of a system in accordance with one embodiment of the present invention.

Thus, referring to FIG. 16, the conductor 18 may be transverse to two column conductors 38 in this embodiment. A via (not shown) may connect the upper conductor 38*a* to the underlying lower conductor 18. On the right in FIG. 14, the wall heater layer 22 is adjacent the memory material 32. The heater 22*a* is aligned centrally under the material 32 and centrally over the conductor 18. Current flow between conductors 18 and 38 results in electrical resistance heat developed by the heater 22*a* which heats the material 32.

The material 32 has an oval shape as a result of forming the trench 52 in an oval shape in FIG. 13, also causing the spacer 30 to have a corresponding oval shape. Thus, the elongate shape of the phase change material 32 in the column or upper electrode direction provides alignment tolerances between that material 32 and the overlying threshold device 120, as well as the underlying wall heater 22*a*. Other elongate shapes, including rectangles and ellipses, may also be used.

Because the wall heater 22*a* is U-shaped, its area may be reduced to a value below two-dimensional lithographic capabilities and the bulk of the heater 22 can be annealed or treated post deposition in some embodiments of the present invention.

Switching material 32 may be a phase change, programmable material capable of being programmed into one of at least two memory states by applying a current to switching material 32 to alter the phase of switching material 32 between a substantially crystalline state and a substantially amorphous state, wherein a resistance of switching material 32 in the substantially amorphous state is greater than the resistance of switching material 32 in the substantially crystalline state.

Programming of switching material 32 to alter the state or phase of the material may be accomplished by applying voltage potentials to conductors 14 and 38, thereby generating a voltage potential across select device 120 and memory element 130. When the voltage potential is greater than the threshold voltage of select device 120 and memory element 130, then an electrical current may flow through memory material 32 in response to the applied voltage potential, and may result in heating of memory material 32.

This heating may alter the memory state or phase of memory material 32. Altering the phase or state of memory material 32 may alter the electrical characteristic of memory material 32, e.g., the resistance of the material may be altered by altering the phase of the memory material 32. Memory material 32 may also be referred to as a programmable resistive material.

In the "reset" state, memory material 32 may be in an amorphous or semi-amorphous state and in the "set" state, memory material 32 may be in an a crystalline or semi-crystalline state. The resistance of memory material 32 in the amorphous or semi-amorphous state may be greater than the resistance of memory material 32 in the crystalline or semi-crystalline state. It is to be appreciated that the association of reset and set with amorphous and crystalline states, respectively, is a convention and that at least an opposite convention may be adopted.

Using electrical current, memory material 32 may be heated to a relatively higher temperature to amorphosize memory material 32 and "reset" memory material 32 (e.g., program memory material 32 to a logic "0" value). Heating the volume of memory material 32 to a relatively lower crystallization temperature may crystallize memory material 32 and "set" memory material 32 (e.g., program memory material 32 to a logic "1" value). Various resistances of memory material 32 may be achieved to store information by varying the amount of current flow and duration through the volume of memory material 32.

Although the scope of the present invention is not limited in this respect, the heater 22a may be titanium (Ti), titanium nitride (TiN), titanium tungsten (TiW), carbon (C), silicon carbide (SiC), titanium aluminum nitride (TiAlN), titanium silicon nitride (TiSiN), polycrystalline silicon, tantalum nitride (TaN), some combination of these films, or other suitable conductors or resistive conductors compatible with switching material 32.

Although the scope of the present invention is not limited in this respect, in one example, the composition of switching material 42 may comprise a Si concentration of about 14%, a Te concentration of about 39%, an As concentration of about 37%, a Ge concentration of about 9%, and an In concentration of about 1%. In another example, the composition of switching material 24 may comprise a Si concentration of about 14%, a Te concentration of about 39%, an As concentration of about 37%, a Ge concentration of about 9%, and a P concentration of about 1%. In these examples, the percentages are atomic percentages which total 100% of the atoms of the constituent elements.

In another embodiment, a composition for switching material 42 may include an alloy of arsenic (As), tellurium (Te), sulfur (S), germanium (Ge), selenium (Se), and antimony (Sb) with respective atomic percentages of 10%, 21%, 2%, 15%, 50%, and 2%.

Although the scope of the present invention is not limited in this respect, in other embodiments, switching material 42 may include Si, Te, As, Ge, sulfur (S), and selenium (Se). As an example, the composition of switching material 42 may comprise a Si concentration of about 5%, a Te concentration of about 34%, an As concentration of about 28%, a Ge concentration of about 11%, a S concentration of about 21%, and a Se concentration of about 1%.

Conductive material 42, 44 may be a thin film material having a thickness ranging from about 20 Å to about 2000 Å. In one embodiment, the thickness of the material 28 may range from about 100 Å to about 1000 Å. In another embodiment, the thickness of the conductive material 42, 44 may be about 300 Å. Suitable materials may include a thin film of titanium (Ti), titanium nitride (TiN), titanium tungsten (TiW), carbon (C), silicon carbide (SiC), titanium aluminum nitride (TiAlN), titanium silicon nitride (TiSiN), polycrystalline silicon, tantalum nitride (TaN), some combination of these films, or other suitable conductors or resistive conductors compatible with switching material 42.

Turning to FIG. 15, a portion of a system 500 in accordance with an embodiment of the present invention is described. System 500 may be used in wireless devices such as, for example, a personal digital assistant (PDA), a laptop or portable computer with wireless capability, a web tablet, a wireless telephone, a pager, an instant messaging device, a digital music player, a digital camera, or other devices that may be adapted to transmit and/or receive information wirelessly. System 500 may be used in any of the following systems: a wireless local area network (WLAN) system, a wireless personal area network (WPAN) system, a cellular network, although the scope of the present invention is not limited in this respect.

System 500 may include a controller 510, an input/output (I/O) device 520 (e.g. a keypad, display), a memory 530, and a wireless interface 540 coupled to each other via a bus 550. It should be noted that the scope of the present invention is not limited to embodiments having any or all of these components.

Controller 510 may comprise, for example, one or more microprocessors, digital signal processors, microcontrollers, or the like. Memory 530 may be used to store messages transmitted to or by system 500. Memory 530 may also optionally be used to store instructions that are executed by controller 510 during the operation of system 500, and may be used to store user data. Memory 530 may be provided by one or more different types of memory. For example, memory 530 may comprise any type of random access memory, a volatile memory, a non-volatile memory such as a flash memory and/or a memory such as memory 100 discussed herein.

I/O device 520 may be used by a user to generate a message. System 500 may use wireless interface 540 to transmit and receive messages to and from a wireless communication network with a radio frequency (RF) signal. Examples of wireless interface 540 may include an antenna or a wireless transceiver, although the scope of the present invention is not limited in this respect.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   forming a heater layer contacting a first conductive material, the heater layer including titanium silicon nitride (TiSiN) generated from tetrakis-(dimethlamino)-titanium (TDMAT) and tris-(dimethlamino)-saline (TrDMASi), the TiSiN of the heater distinct from the first conductive material, wherein a heater formed from the heater layer is L-shaped;
   forming a phase change memory material layer over the heater layer; and
   forming a second conductive layer over the phase change memory material layer.

2. The method of claim 1, wherein forming the heater layer comprises, contemporaneously:
   vaporizing the TDMAT in a first bubbler; and
   vaporizing the TrDMASi in a second bubbler.

3. The method of claim 2, further comprising controlling a ratio of the TDMAT to the TrDMASi by at least one of:
   adjusting a temperature or a pressure of the first bubbler; and
   adjusting a temperature or a pressure of the second bubbler.

4. The method of claim 3, wherein the ratio of the TDMAT to the TrDMASi is approximately one part TDMAT to ten parts TrDMASi.

5. The method of claim 2, further comprising:
   heating the first bubbler to a first temperature; and
   heating the second bubbler to a second temperature.

6. The method of claim 5, wherein the first temperature is approximately equal to the second temperature.

7. The method of claim 5, wherein the temperature of the first bubbler and the temperature of the second bubbler are each approximately 50 degrees Celsius.

8. The method of claim 1, wherein a thickness of the heater layer is approximately 50 angstroms.

9. A method comprising:
etching a trench in an oxide layer and a nitride layer, wherein the trench exposes a conductive material;
depositing tetrakis-(dimethlamino)-titanium (TDMAT) and tris-(dimethlamino)-saline (TrDMASi) in the trench to form a titanium silicon nitride (TiSiN) layer, the TiSiN layer contacting the conductive material, wherein the TiSiN layer is distinct from the conductive material; and
removing a portion of the TiSiN layer; wherein a remaining portion of the TiSiN layer is L-shaped.

10. The method of claim 9, wherein a vertical wall of the trench is aligned with a horizontal center of the conductive material.

11. The method of claim 9, further comprising masking the remaining portion of the trench prior to removing the portion of the TiSiN layer; wherein removing the portion of the TiSiN layer exposes a portion of the conductive material, wherein a vertical portion of the L-shape of the remaining portion of the TiSiN layer contacts a vertical wall of the trench and a base portion of the L-shape of the remaining portion of the TiSiN layer contacts the conductive material.

12. The method of claim 11, further comprising forming a phase change memory material layer that contacts the remaining portion of the TiSiN layer at the vertical portion of the L-shape.

13. The method of claim 11, further comprising forming a phase change memory material layer that contacts the remaining portion of the TiSiN layer at the vertical portion of the L-shape.

14. A method comprising:
forming a heater layer over a conductive material, wherein a heater formed from the heater layer is L-shaped, wherein a material of the heater layer is distinct from the first conductive material; and
forming a phase change memory material layer contacting the heater layer.

15. The method of claim 14, wherein forming, the heater layer comprises depositing tetrakis-(dimethlamino)-titanium (TDMAT) and tris-(dimethlamino)-saline (TrDMASi) to form, a titanium silicon nitride (TiSiN) layer.

16. The method of claim 14, wherein the heater layer comprises 10 atomic percent silicon to 20 atomic percent silicon.

17. The method of claim 14, further comprising forming a select device over the phase change memory material layer.

18. The method of claim 17, wherein the select device comprises an ovonic threshold switch.

19. The method of claim 14, wherein forming the phase change memory material layer comprises depositing a chalcogenide alloy material.

20. The method of claim 14, wherein a resistivity of the conductive material is less than a resistivity of the heater layer.

* * * * *

UNITED STATES PATENT AND TRADEMARK OFFICE
CERTIFICATE OF CORRECTION

PATENT NO. : 8,501,523 B2  
APPLICATION NO. : 10/977186  
DATED : August 6, 2013  
INVENTOR(S) : Jong-Won Lee et al.

It is certified that error appears in the above-identified patent and that said Letters Patent is hereby corrected as shown below:

In the Claims

In column 8, line 39, in Claim 1, delete "(dimethlamino)" and insert -- (dimethylamino) --, therefor.

In column 8, line 40, in Claim 1, delete "(dimethlamino)" and insert -- (dimethylamino) --, therefor.

In column 9, line 6, in Claim 9, delete "(dimethlamino)" and insert -- (dimethylamino) --, therefor.

In column 9, line 7, in Claim 9, delete "(dimethlamino)" and insert -- (dimethylamino) --, therefor.

In column 9, line 12, in Claim 9, delete "layer;" and insert -- layer, --, therefor.

In column 10, line 12, in Claim 15, delete "forming," and insert -- forming --, therefor.

In column 10, line 13, in Claim 15, delete "(dimethlamino)" and insert -- (dimethylamino) --, therefor.

In column 10, line 14, in Claim 15, delete "(dimethlamino)" and insert -- (dimethylamino) --, therefor.

In column 10, line 15, in Claim 15, delete "form," and insert -- form --, therefor.

Signed and Sealed this  
Twenty-ninth Day of October, 2013

Teresa Stanek Rea  
*Deputy Director of the United States Patent and Trademark Office*